United States Patent [19]

Jeong

[11] Patent Number: 5,365,489
[45] Date of Patent: Nov. 15, 1994

[54] DUAL PORT VIDEO RANDOM ACCESS MEMORY WITH BLOCK WRITE CAPABILITY

[75] Inventor: Seong-ouk Jeong, Seoul, Rep. of Korea

[73] Assignee: Samsung Electronics Co., Ltd., Kyunggui-do

[21] Appl. No.: 877,235

[22] Filed: May 1, 1992

[30] Foreign Application Priority Data

Jan. 10, 1992 [KR] Rep. of Korea .................. 92-265

[51] Int. Cl.[5] ........................ G11C 8/00; G11C 8/04
[52] U.S. Cl. ...................... 365/230.03; 365/230.02; 365/189.02; 365/230.06; 365/238.5
[58] Field of Search .................. 365/230.03, 230.06, 365/189.02, 189.08, 230.02, 235

[56] References Cited

U.S. PATENT DOCUMENTS

| | | | |
|---|---|---|---|
| 4,807,189 | 2/1989 | Pinkham et al. | 365/189 |
| 4,961,171 | 10/1990 | Pinkham et al. | 365/230.02 |
| 5,208,775 | 5/1993 | Lee | 365/230.05 |

*Primary Examiner*—Eugene R. LaRoche
*Assistant Examiner*—Huan Hoang
*Attorney, Agent, or Firm*—Cushman, Darby & Cushman

[57] ABSTRACT

A dual port video random access memory device operates as a dual port by adding a serial access memory portion to a dynamic random access memory portion. A block write function can be selectively performed by multiplexing either a decoded signal corresponding to the two least significant bits of a column address or a 4 bit data input. An improved memory device construction is taught which reduces the total number of transistors necessary to perform the dual port function of prior art memory devices. As a result, chip layout and chip miniaturization can be realized.

4 Claims, 3 Drawing Sheets

DUAL PORT VIDEO RANDOM ACCESS MEMORY WITH BLOCK WRITE CAPABILITY

BACKGROUND OF THE INVENTION

1. Field of the Invention

The present invention relates to a video random access memory device, and particularly, to a dual port video random access memory device having a block write function.

2. Description of the Related Art

A video random access memory VRAM is a kind of image exclusive memory that operates as a dual port by adding a serial access memory SAM section to a normal dynamic random access memory DRAM.

This device comprises a RAM section capable of randomly reading and writing data and a SAM section capable of serially data accessing across data transmission paths existing between the two memory sections.

The SAM section is formed of data registers storing data as in a static random access memory SRAM cell and has the characteristic of fast access time.

The dual port random access memory device has been developed to provide increased access capability to memory content in a data processing device, and high speed data output to a video display.

The dual port memory operates by having a first port for random access and update of memory under the control of a computer system data processing device and a second port, which is non-synchronous and independent from the first port, for serial output of memory content to a video display so that memory access takes place during data output to the video display terminal.

The dual port random access memory device disclosed in U.S. Pat. No. 4,807,189 requires that the 2 least significant bits of a column address be replaced by a 4 bit data input during a block write function.

As a result, the dual port memory must selectively multiplex either the 2 LSB column address or the 4 bit data input to execute normal DRAM and block write functions.

SUMMARY OF THE INVENTION

Therefore, it is an object of the present invention to provide a semiconductor memory device capable of performing a block write function wherein the layout area during integration can be reduced.

To achieve the above-stated object, a semiconductor memory device for performing a memory block write function is provided which includes:

a plurality of cell array blocks, each cell array block including a plurality of bit lines;

a plurality of column select transistors coupled to said plurality of cell array blocks for selectively accessing corresponding ones of said plurality of bit lines;

first decoding means, responsive to a portion of a column address for generating a first select signal for selecting one of said plurality of cell array blocks;

second decoding means, responsive to the remaining portion of said column address, for generating a second select signal;

multiplexing means for selectively outputting one of said second select signal and an external block write signal in response to a block write mode control signal; and a plurality of transfer transistors coupled to said multiplexing means and said first decoding means, for driving select ones of said plurality of column select transistors in the selected one of said plurality of all array blocks in response to the selectively multiplexed output of said multiplexing means.

BRIEF DESCRIPTION OF THE DRAWINGS

The above object and other advantages of the present invention will become more fully understood by the following description of the preferred embodiment of the present invention with reference to the attached drawings in which.

DETAILED DESCRIPTION OF THE PREFERRED EMBODIMENT

A brief explanation of the conventional technology now follows before explaining the multiplexing of a 4 bit data input and the 2 LSB column address of a semiconductor memory device having a block write function according to the present invention with reference to the accompanying drawings.

Figure 1:
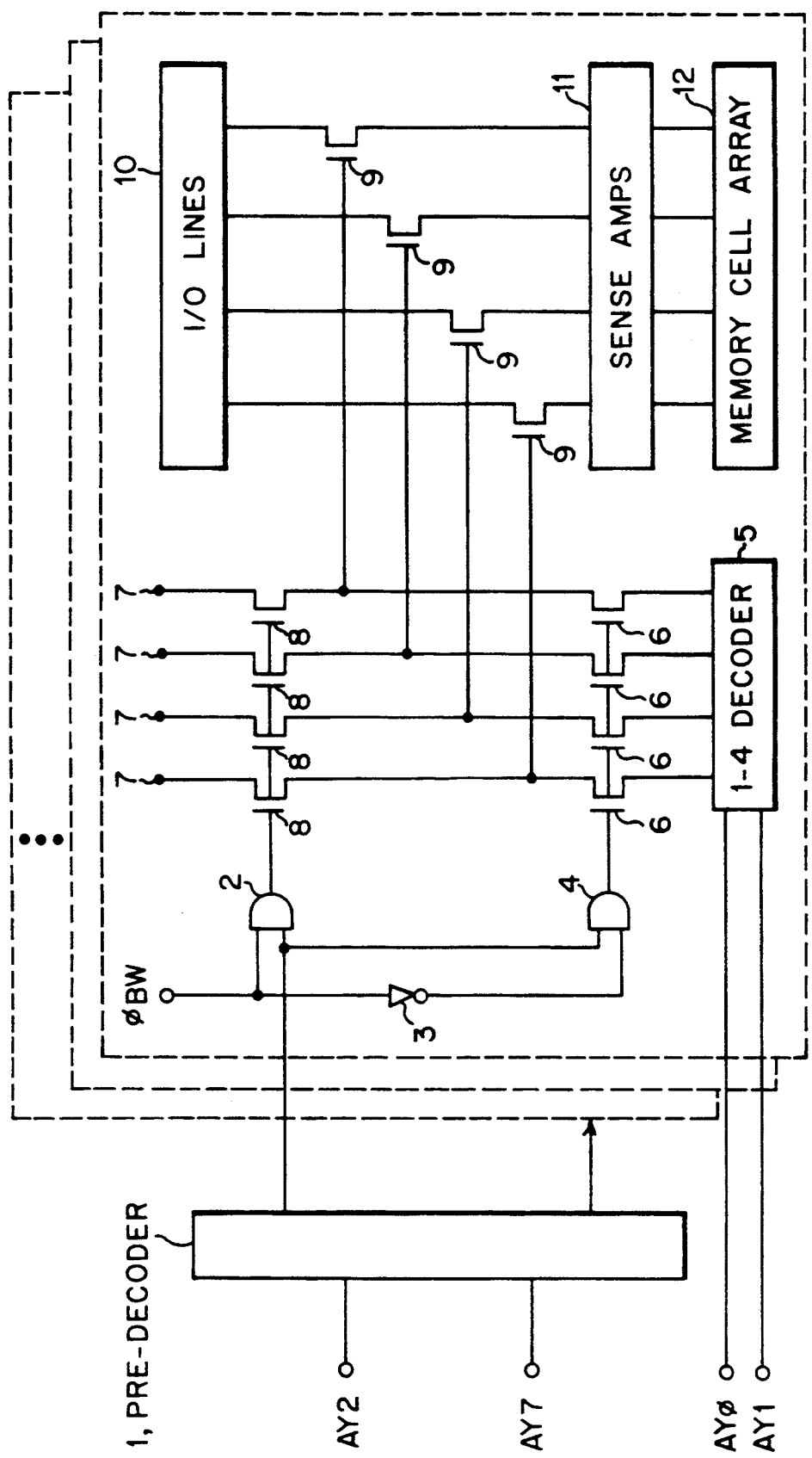
FIG. 1 is a schematic diagram of a conventional column address decoder for executing a block write function.

FIG. 1 is a schematic diagram for illustrating a conventional circuit for multiplexing a 2 LSB column address decoder and 4 data input.

In FIG. 1, pre-decoder 1 inputs and decodes the remaining 6 bit column address AY2-AY7 to generate an output of 64 bits after excluding the 2 LSB.

AND gate 2 inputs and logically multiplies control signal $\phi$ BW for enabling a block write function with an output signal of pre-decoder 1.

AND gate 4 inputs and logically multiplies the inverted control signal $\phi$ BW inverted by inverter 3 for disabling the block write function with an output signal of pre-decoder 1.

1-4 decoder 5 inputs and decodes 2 LSB column addresses AY0 and AY1 and generates a 4 bit output.

The gates of NMOS transfer transistors 6 are connected to the output of AND gate 4. The gates of NMOS transfer transistors 8 are connected to the output of AND gate 2.

One electrode of NMOS transfer transistors 6 and one electrode of NMOS transfer transistors 8 are commonly connected and the common nodes are connected to the individual, respective gates of each column select transistors 9.

The other electrode of each NMOS transfer transistor 8 is connected to each data input terminal 7 and the other electrode of each NMOS transfer transistor 6 is connected to the 4 output terminals of the 1-4 bit decoder 5.

One electrode of each of the NMOS column select transistors 9 is connected to respective input/output lines 10 and the other electrodes are connected to respective sense amplifiers 11.

The operation of the circuit according to the above construction is as follows.

When control signal $\phi$ BW is at a high logic level, the output of AND gate 4 is at a low logic level and the output of AND gate 2 becomes a high logic level and turns on the NMOS transfer transistors 8.

The signal from the 4 bit data input terminal 7 passes through the NMOS transfer transistors 8 and turns on the NMOS column select transistors 9, so that data transfer of a block unit between the input/output lines 10 and sense amplifier 11 can be performed.

When control signal $\phi$ BW is a low logic level, the output of AND gate 2 is a low logic level and the output of AND gate 4 becomes a high logic level and turns on the NMOS transfer transistors 6.

The output signals of the 1–4 decoder 5 passes through the NMOS transfer transistors 6 and is applied to the gate of the NMOS column select transistors 9 and turns on the NMOS column select transistors 9 in response to the output signals of the 1–4 decoder 5 and transfers data between corresponding input/output lines 10 and the sense amplifiers 11.

More specifically, the column address method for executing one conventional block write function is carried out as a column address only and the 2 LSB column address multiplexes the 4 bit data input at the path controlling column select transistors 9.

In a conventional device, the layout area is great because the number of NMOS transfer transistors 8 needed are as many as the number of bit lines and, the number of AND gates 2 needed are equal to the number of bit lines divided by 4.

Figure 2A:
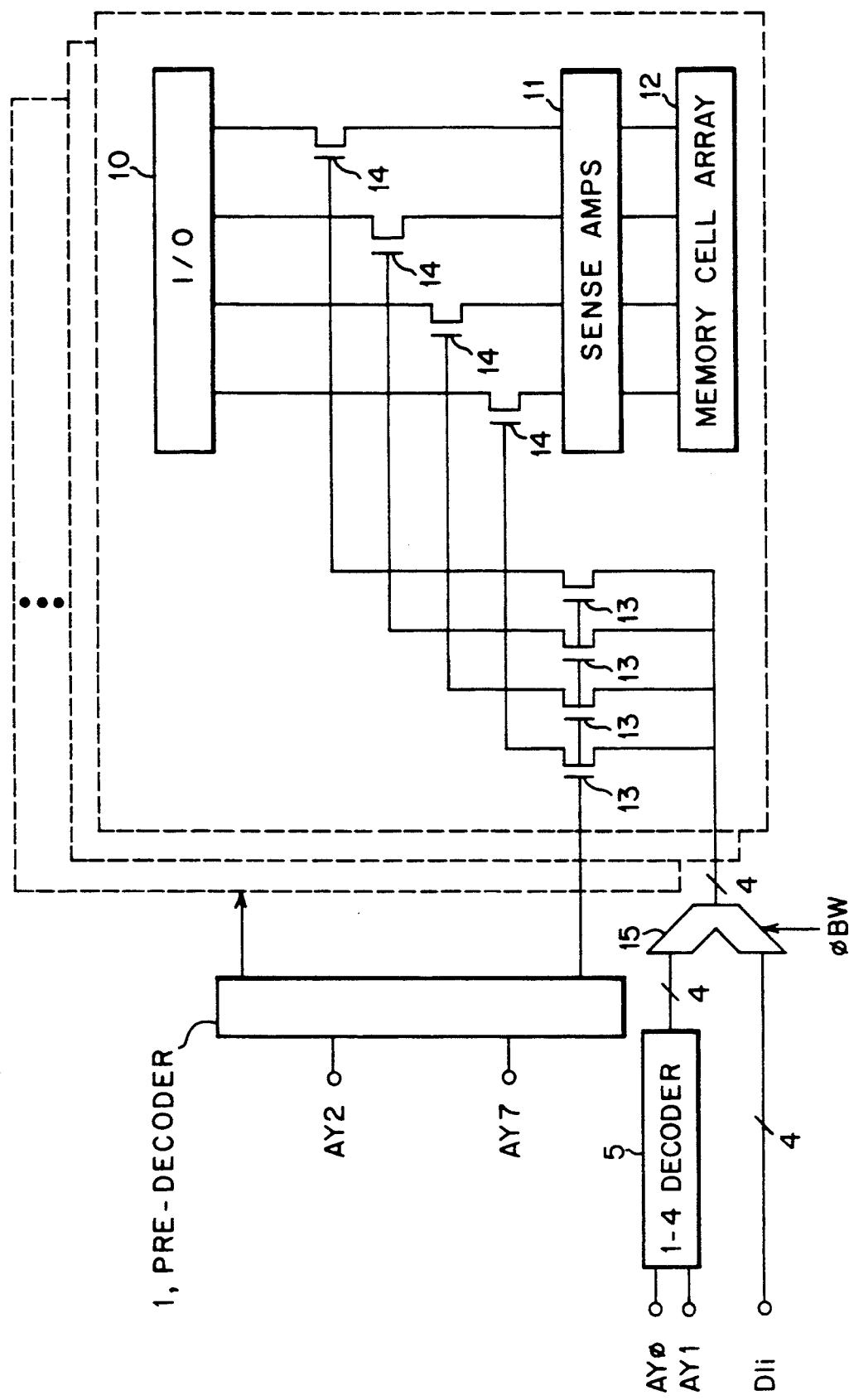
FIG. 2A is a schematic diagram of a column address decoder for executing a block write function according to the present invention.

FIG. 2A shows the column address decode for executing a block write function according to the present invention.

Pre-decoder 1 inputs and decodes a 6 bit column address AY2–AY7, but not the 2 LSB column addresses AY0 and AY1, and generates a 64 bit output.

1–4 decoder 5 inputs and decodes the 2 LSB column addresses AY0 and AY1 and generates a 4 bit output.

Multiplexer 15 inputs a 4 bit data input signal and the output signal of the 1–4 decoder 5 and, in response to control signal $\phi$ BW for executing the block write function, selects and outputs signals of one group among the 2 groups input.

Output signals of pre-decoder 1 are connected to respective gates of NMOS transfer transistors 13.

NMOS transfer transistors 13 apply the output signal of the multiplexer 15 to the gates of NMOS transfer transistors 14.

NMOS transfer transistors 14 control data transfer between input/output lines 10 and a memory cell array 12 connected to sense amplifiers 11.

Operation of the above-structured circuit is as follows.

When the control signal $\phi$ BW becomes enabled to implement the block write function, the multiplexer 15 selectively outputs a 4 bit data input signal DIi.

Pre-decoder 1 enables one output and the NMOS transfer transistors 13 are turned on in response to that output.

The output signal of the multiplexer 15 passes through the NMOS transfer transistors 13 and is applied to the gates of the NMOS transfer transistors 14.

The NMOS transfer transistors 14 are turned on and transfer of data as a block unit between I/O lines 10 and sense amplifiers 11 is possible.

When the control signal $\phi$ BW for carrying out the block write function becomes disabled, the multiplexer 15 outputs an output signal of the 1–4 decoder 5 to execute a normal write function.

Figure 2B:
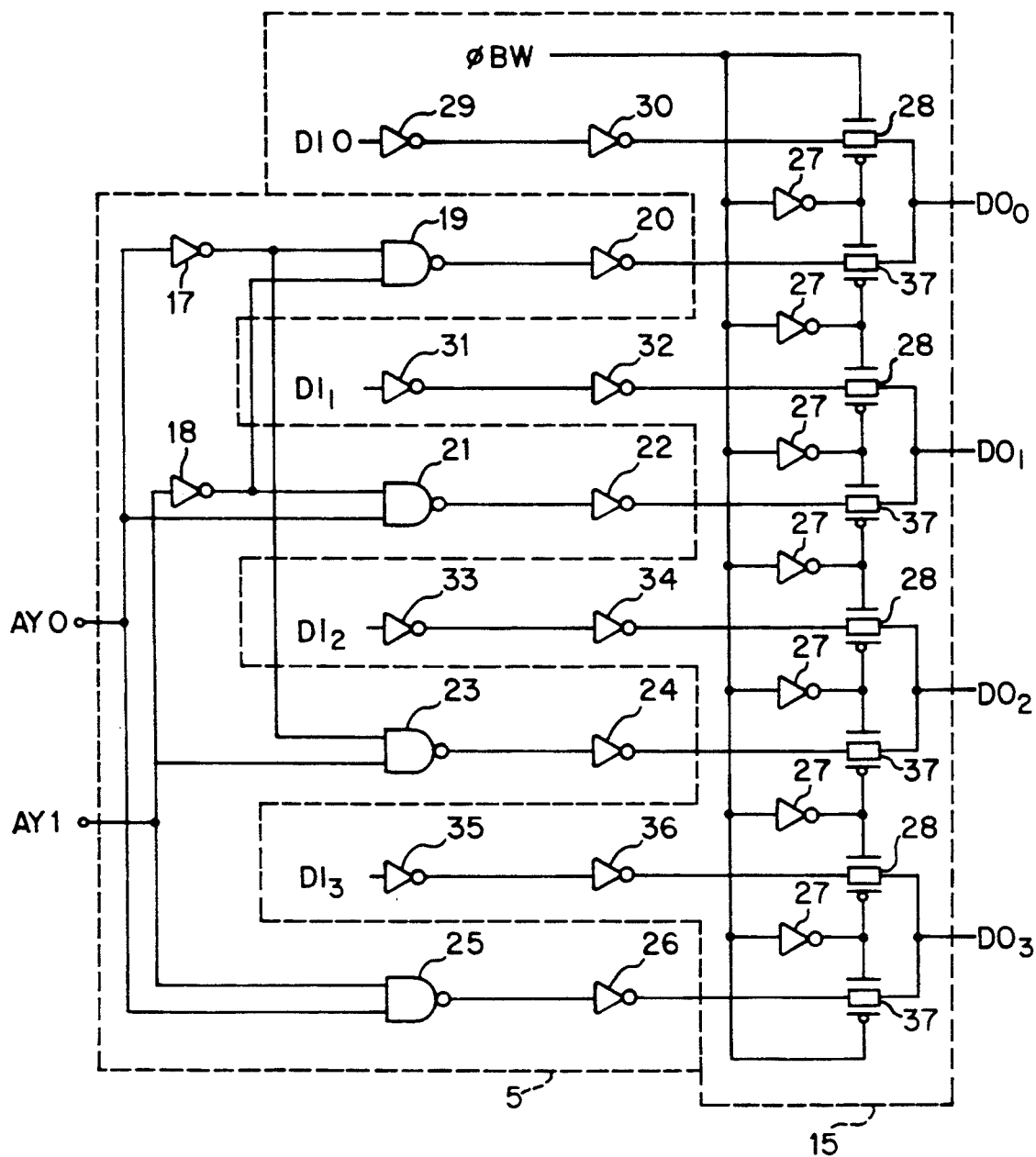
FIG. 2B is an embodiment of the multiplexing circuit of FIG. 2A.

FIG. 2B shows in greater detail a circuit for multiplexing the 2 LSB column address and the 4 bit data input.

The decoding operation is made up of an inverter 17 receiving and inverting column address AY0; an inverter 18 receiving and inverting column address AY1; a NAND gate 19 and inverter 20 for receiving and logically producing NAND gate output signals using outputs from inverters 17 and 18; a NAND gate 21 and inverter 22 receiving and logically producing the output signals of inverter 18 and column address AY0; a NAND gate 23 and inverter 24 receiving and logically producing the output signals of inverter 17 and column address AY1; a NAND gate 25 and inverter 26 receiving and logically producing column addresses AY0 and AY1.

When control signal $\phi$ BW for carrying out a block write function is at a high logic level, the output signal of inverter 27 is at a low logic level.

CMOS transfer gates 28 are turned on, and data inputs $DI_0$, $DI_1$, $DI_2$, and $DI_3$, are respectively transferred to data outputs $DO_0$, $DO_1$, $DO_2$, and $DO_3$.

Inverters 29 and 30 buffer data input as signal $DI_0$, inverters 31 and 32 buffer data input as signal $DI_1$, inverters 33 and 34 buffer data input as signal $DI_2$, and inverters 35 and 36 buffer data as input signal $DI_3$ to apply the signal to respective CMOS transfer gates 28.

To perform a normal write function, when control signal $\phi$ BW is at a low logic level, the CMOS transfer gates 37 are turned on and the output signals of inverters 20, 22, 24, and 26 are respectively output to data outputs $DO_0$, $DO_1$, $DO_2$, and $DO_3$.

Here, when making a general comparison of the required number of transistors in a column address decoding circuit of the prior art and the present invention, 192 PMOS transistors and 148 NMOS transistors are required in the prior art device while only 40 PMOS and 40 NMOS transistors are required in the device of the present invention.

Accordingly, the column address decoding circuit for carrying out a block write function according to the present invention decodes a 2 LSB column address.

When multiplexing that decoded output and a 4 bit data input, the circuit is simplified by reducing the number of transistors compared with the conventional circuit and thus enables a reduction in the integrated circuit layout area.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A semiconductor memory device for performing a memory block write function, said semiconductor memory device comprising:

a plurality of cell array blocks, each cell array block including a plurality of bit lines;

a plurality of column select transistors coupled to said plurality of cell array blocks for selectively accessing corresponding ones of said plurality of bit lines;

first decoding means, responsive to a first portion of a column address, for generating a first select signal for selecting one of said plurality of cell array blocks;

second decoding means, responsive to a second portion of said column address, for generating a second select signal;

multiplexing means for selectively outputting one of said second select signal and an external block write signal in response to a block write mode control signal; and a plurality of transfer transistors coupled to said multiplexing means and directly to said first decoding means, for driving select ones of said plurality of column select transistors in said selected one of said plurality of cell array blocks in response to said selectively multiplexed output of said multiplexing means.

2. A semiconductor memory device as in claim 1, wherein each of said cell array blocks include four bit lines arranged in nibble mode.

3. A semiconductor memory device as in claim 1, wherein said multiplexing means comprises CMOS transfer gates responsive to said block write mode control signal for selectively transferring one of said second select signal and said external block write signal.

4. A semiconductor memory device as in claim 2, wherein said multiplexing means comprises CMOS transfer gates responsive to said block write mode control signal for selectively transferring one of said second select signal and said external block write signal.

* * * * *